United States Patent [19]
Chapman et al.
[11] 3,947,733
[45] Mar. 30, 1976

[54] CONTROL CIRCUIT

[76] Inventors: Charles Robert Chapman, 13620 S. Vermont Ave., Gardena, Calif. 90247; James William Schooler, 2784 Diana Ave., Anaheim, Calif. 92806

[22] Filed: Jan. 27, 1975

[21] Appl. No.: 544,499

[52] U.S. Cl. .................................. 317/132; 317/131
[51] Int. Cl.$^2$ .......................................... H03H 9/00
[58] Field of Search .. 317/131, 132, 133.5, 142 TD, 317/148.5 B

[56] References Cited

UNITED STATES PATENTS

| | | | |
|---|---|---|---|
| 3,258,655 | 6/1966 | Pinckuers | 317/132 X |
| 3,417,305 | 12/1968 | Russell | 317/132 UX |

*Primary Examiner*—R. N. Envall, Jr.
*Attorney, Agent, or Firm*—Edward E. Roberts; Philip A. Dalton

[57] ABSTRACT

A temperature-actuated circuit for controlling the application of an electronic circuit. In a typical application, the control circuit shunts a circuit which effects enrichment of the fuel mixture for the cold-starting of internal combustion engines. In a preferred embodiment, the control circuit comprises a temperature-dependent resistance, such as a thermistor, which supplies changing voltage with increasing engine temperature to the gate of an SCR. After an interval necessary to attain a predetermined engine temperature, the altered gate voltage triggers the SCR, thereby actuating a relay associated with the enrichment circuit for shunting the enrichment circuit from the fuel injection circuit. Typically, the enrichment circuit alters the width of square wave signals which control fuel delivery, so that bypassing the circuit eliminates the altered wave characteristics and provides leaner, more economical operation.

The control circuit components may be selected to provide time delay operation, rather than operation controlled by an external temperature. Also, the control circuit can include features such as manual override and visual and/or audible operation displays.

14 Claims, 1 Drawing Figure

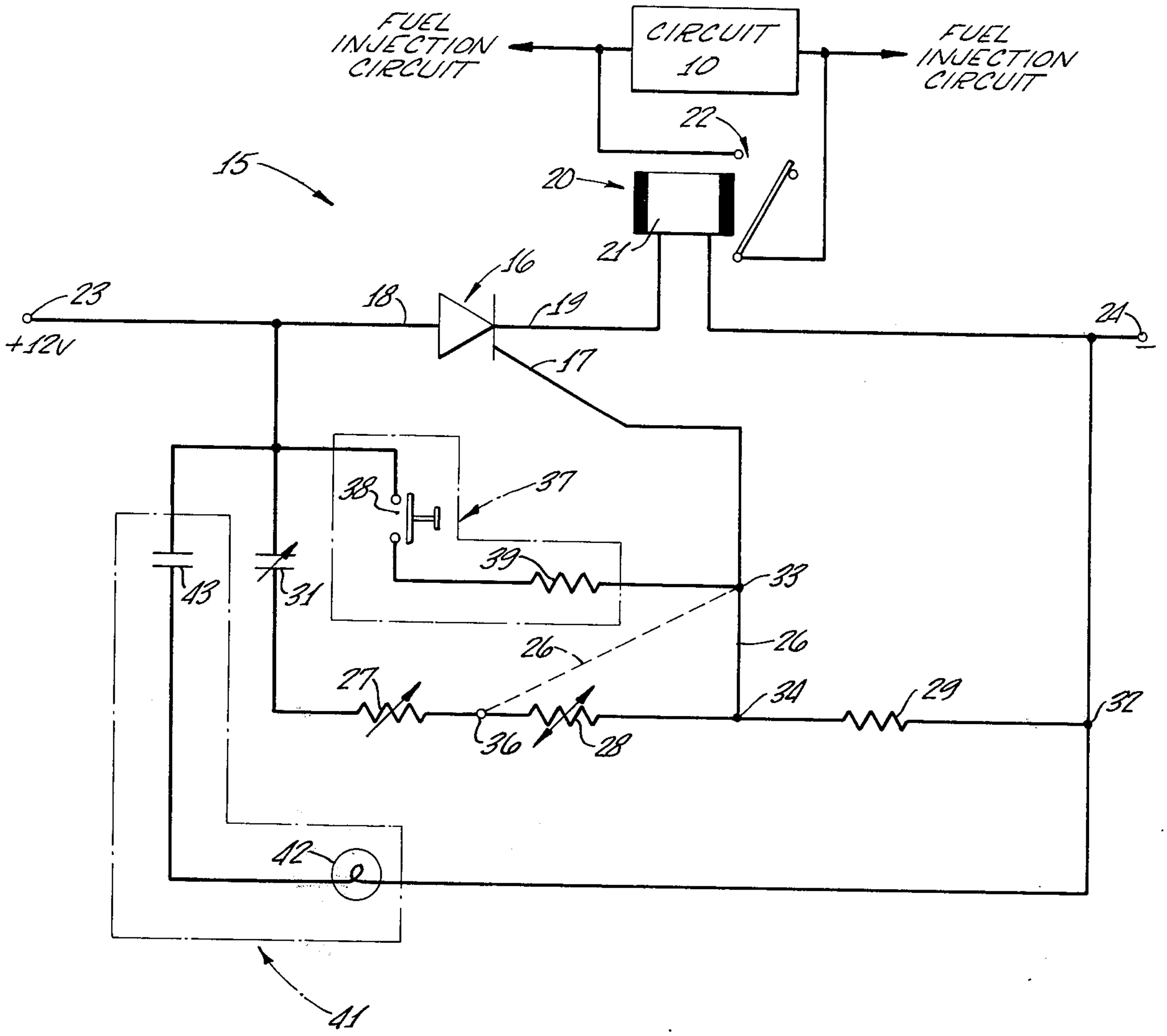
FUEL INJECTION CIRCUIT
CIRCUIT 10
FUEL INJECTION CIRCUIT
22
15
20
21
16
23
18
19
24
+12V
17
37
38
39
33
43
31
26
26
27
34
29
32
36
28
42
41

CONTROL CIRCUIT

BACKGROUND OF THE INVENTION

1. Field of the Invention

This invention relates to systems and methods for controlling the application of electronic circuits and, more particularly, to a temperature-actuated control circuit for shunting a fuel mixture enrichment circuit from a fuel delivery control circuit for internal combustion engines.

2. Description of the Prior Art

The requirement for increasingly reduced automobile emissions exacerbates problems such as cold starting, stalling and backfiring prior to engine warm-up, and the hazards inherent to entering and moving with traffic prior to engine warm-up. These problems are evident in many fuel injection systems, which frequently use computer-type circuits to control the fuel mixture and delivery. The problems can be alleviated by providing systems for altering the fuel delivery, typically by enrichening the fuel mixture.

Preferably, in view of the increasing cost and decreasing supply of gasoline, systems are also provided for inactuating or bypassing the fuel altering or enrichening systems after engine warm-up. Such systems may be based on dependency on external temperature variations or on time-delay characteristics. However, the prior art systems are relatively complex and are therefore more costly and more prone to failure than would be simpler systems.

As may be thus appreciated, it is desirable to have a simple, yet effective, and preferably, adjustable, automatic control circuit for controlling the operation, or connection to a fuel delivery control circuit, of a fuel enrichment circuit.

SUMMARY OF THE INVENTION

A temperature-actuated control circuit comprises an SCR, a temperature-dependent resistor and a control resistor. The SCR and the resistors are inter-connected such that application of a reference potential across the SCR applies current across the resistors. The control resistor then applies potential to the gate of the SCR, and this potential increases due to external heating or $I^2R$ heating of the temperature-dependent resistor, until the SCR fires. The SCR applies a signal to a device such as a relay to disconnect (connect) one circuit from (to) another.

BRIEF DESCRIPTION OF THE DRAWINGS

FIG. 1 is a schematic representation of a temperature-actuated control circuit embodying the principles of the present invention showing an arrangement for connection to a controlled circuit.

DETAILED DESCRIPTION

Referring to FIG. 1, there is shown a representation of electronic apparatus of circuit 10 which is to be automatically disconnected from associated circuit(s) (not shown) upon the attainment of a prescribed set of conditions. As will be appreciated by those skilled in the art, the circuit 10 and the associated circuit(s) may be of various types. However, to illustrate a preferred embodiment, circuit 15 is connected to, and may be a portion of, a fuel injection circuit (not shown) and comprises apparatus for enrichening the fuel mixture provided by the fuel injection circuit.

Referring further to FIG. 1, there is shown a temperature-actuated control circuit 15 which automatically shunts the circuit 10 from, or interconnects the circuit 10 with, the fuel injection circuit. Circuit 15 comprises an SCR 16 which is actuated by the application to gate electrode 17 of a threshold potential of predetermined magnitude in the presence of a reference potential which is within a requisite range applied across electrodes 18 and 19. Circuit 15 also comprises a relay 20, coil 21 of which is energized by a signal supplied by the actuated SCR 16 for closing a normally open set 22 of contacts. In closing, the contacts 22 provide a circuit path about the circuit 10, thereby shunting the circuit 10 from the illustrative fuel injection circuit. Of course, the contacts 22 may be normally closed, so that operation of the relay opens the contacts in order to establish a circuit path through the circuit 10 and thereby connect the circuit 10 to the fuel injection circuit.

The reference potential across SCR terminals 18 and 19 is illustratively applied via terminals 23 and 24. Because the circuit 15 is particularly suitable for use with automobile fuel delivery systems, a reference potential of 12 v. will be described hereinafter. The threshold potential is applied to gate electrode 17 via circuit path 26, which connects to a circuit path containing adjustable resistor (potentiometer) 27, temperature-dependent resistor 28, resistor 29 and a normally closed set 31 of contacts. The contacts 31 are controlled by coil 21 and can be part of coil 20. Temperature-dependent resistor 29 may be a thermistor which is situated proximate to the engine head, the exhaust manifold, in the coolant system, or the like, so that the resistance variation accurately reflects a changing temperature associated with engine operation.

The circuit path formed by resistors 27, 28, 29 and normally closed contacts 31 is connected in parallel with SCR 16 and relay coil 21 between electrodes 23 and 24. Thus, when the reference potential is applied to terminals 23 and 24 (e.g. by turning on the engine ignition), current is established across the resistors and contacts, but not across the SCR and relay, since for a cold engine, the initial potential at the gate electrode 17 is insufficient to actuate SCR 16. For a particular SCR 16, the SCR is actuated at the desired engine temperature by appropriate selection of (1) the resistance values for resistors 27, 28, and 29, (2) the temperature dependence of resistor 28, and (3) the point of connection of circuit path 26 (gate electrode 17) to the circuit path containing the resistors 27, 28, and 29 and the contacts 31.

By properly selecting the aforesaid parameters, the potential drop across points 32 and 33 (here, across resistor 29) will be insufficient initially to fire SCR 16. Then, as the resistance of resistor 28 varies due to increasing engine temperature, at a predetermined engine temperature a sufficient, threshold voltage is applied to gate electrode 17 to fire the SCR 16. Consequently, the SCR applies a signal to the relay coil 21, energizing the relay 20 and opening the normally closed contacts 31. This removes power from the thermistor. Also, normally open contacts 22 are closed, shunting the fuel enrichment circuit 10 from the fuel injection circuit and thereby providing a leaner, more economical fuel mixture.

As will be appreciated from reference to FIG. 1, the control circuit 15 will continue to shunt circuit 10 until the reference potential is removed (by turning off the ignition), at which time the SCR-controlled current across the relay 20 stops, and the relay and SCR reset preparatory to ignition turn-on.

The control circuit 15 also has provision for selecting the engine temperature at which the fuel enrichment circuit 10 is shunted. That is, by adjusting potentiometer 27, the voltage drops across resistors 27, 28 and 29, and in particular, across resistor 29, can be adjusted to select the temperature at which the threshold signal and the shunting of circuit 10 are attained.

The point of take-off for the gate electrode 17 may be changed to accommodate negative and positive temperature coefficients for thermistor 28. That is, for a negative coefficient (reduction of resistance with increasing temperature), thermistor 28 can be considered as effectively being part of resistor 27. Circuit path 26 is then connected to point 34. If thermistor 28 has a positive coefficient, it can be considered effectively as part of resistor 29. Circuit path 26 is then connected to point 36, as shown by the dotted line in FIG. 1.

An exemplary control circuit 15 will be described based upon one of the inventors' fuel injected, 1974 VW model 412 automobile. To alleviate cold engine fuel starvation and concomitant problems in this model, a 275–375 ohm resistor can be installed in series with an engine head temperature sensor which is used in the fuel injection circuit. This temperature sensor provides signals to the fuel injection "computer" (essentially, a square wave oscillator) to determine the width of the square wave signals which control the operation of the fuel injection solenoids. The series resistor alters the width of the square wave signals in a suitable manner to provide a richer fuel mixture. This series resistor corresponds to circuit 10 in FIG. 1, and is hereafter referred to as circuit 10 or resistor 10.

Unfortunately, after installation of the resistor 10, the inventors' VW fuel mileage for urban and freeway driving decreased from 25 and 29 mpg, respectively, to 21 and 25 mpg. This was an approximately 15 percent decrease.

The control circuit 15 was used to shunt the fuel enrichment resistor 10 from the VW fuel injection circuit after engine warm-up. The SCR 16 used for the control circuit 15 was model no. MCR 1906-2 made by Motorola Co. This model has a firing point of 0.5 by 0.6 volts D.C. The temperature-dependent resistor 28, thermistor model no. WA24W1, by Fenwall Electronics, Inc., of Massachusetts, had a nominal resistance of 100 ohms at 25°C. The relay 20 was a Potter Brumfield DPDT 12 VDC, model KPR11D, or equivalent. Using a resistor 29 of 200 ohms and setting potentiometer 27 at 500 ohms, the approximately 12 volt automobile charging circuit potential provided the requisite threshold potential at gate electrode 17 to fire the SCR 16 and shunt the resistor 10 at an engine head temperature of − 100°F to + 120°F. At this temperature, the engine was within the range of normal operating temperatures and, with fuel enrichment resistor 10 shunted, performed without noticeable differences from the non-shunted operation, other than a return to the pre-resistor gas mileage.

The circuit 15 may be used for time delay operation. Here, rather than mounting the thermistor 28 to detect engine operating temperature, the resistance values of resistors 27, 28 and 29 are selected to allow sufficient current to flow through thermistor 28 so that the $I^2R$ heating of the current effects the desired change in resistance of the thermistor. Thus, the SCR 16 is fired after a time interval required to attain the requisite change in resistance of thermistor 28 and is not dependent on an external temperature (engine temperature). In this case, the adjustment of potentiometer 27 is actually a time delay adjustment, rather than a temperature adjustment.

Time delay operation was illustrated using the inventors' 12 v. VW automobile, a Fenwall Electronics model WA21W1 thermistor, a Motorola model MCR-1906-2 SCR, a Potter and Brumfield KRP11D relay, and resistors 27 and 29 of 250 ohms and 6 ohms, respectively. With these components and the resistor 27 set at approximately mid-range, the circuit 15 provided a time delay of approximately 10 minutes between ignition turn-on and shunting of the resistor 10. This time delay allowed the engine to attain normal operating temperature before shunting of resistor 10. The time delay can be varied from 0 to 00 with the resistance range of resistor 27.

As shown in FIG. 1, other features can be incorporated into circuit 15. For example, a manual operation circuit 37, comprising, e.g., a manually operated switch 38 in series with resistor 39, can be used to actuate the circuit 15 for shunting resistor 10 when the vehicle operator determines it is unnecessary to wait for automatic actuation. Also, a display circuit 41, typically comprising an audible and/or visual indicator of circuit operation, such as lamp 42, can be used. The indicator means can be actuated, e.g., by closing contacts 43 of a relay (not shown) which is actuated by the SCR-controlled signal.

Thus, there has been described a control circuit which can operate in both external temperature-dependent and time-delay modes. Exemplary embodiments of the circuit and applications thereof have been described. It is to be understood that the above-identified embodiments are simply illustrative of the principles of the invention and that other modifications may be devised without departing from the invention.

What is claimed is:

1. A temperature-actuated control circuit for controlling the application of a portion of an electrical circuit, comprising:

resistance means comprising at least a first resistance and a second, temperature-dependent resistance in series therewith;

an SCR connected to said resistance means for generating a signal in response to a predetermined threshold signal applied via said resistance means to a gate of said SCR in the presence of a reference potential applied to said SCR;

means for selectively applying the reference potential across said resistance means and said contact means, such that, upon attainment of a predetermined temperature by said second resistance, the threshold signal is applied to the gate of said SCR;

contact means including a pair of normally closed contacts in series with said resistance means and actuated in response to the generated signal for opening and closing said contacts; and circuit path means connected across the electrical circuit portion and actuated by the generated signal for controlling the application of a circuit path bypassing the electrical circuit portion.

2. The temperature-actuated control circuit defined in claim 1, wherein said circuit path means is a relay having normally open contacts connected across the electrical circuit portion and actuated by the generated signal for closing said contacts.

3. The temperature-actuated control circuit defined in claim 1 wherein said contact means and said circuit path means comprise a relay having a first pair of normally closed contacts in series with said resistance means and a second pair of normally open contacts connected across the electrical circuit portion, said relay being actuated by the generated signal for opening and closing said respective first and second contact pairs.

4. The temperature-actuated control circuit defined in claim 1, further comprising manually operated switching means associated with said resistance means and said gate for shunting said second resistance to apply the threshold potential to said SCR.

5. The temperature-actuated control circuit defined in claim 1 further comprising a monitoring circuit actuated by the generated signal for displaying the operated or nonoperated state of the temperature-actuated control circuit.

6. The temperature-actuated control circuit defined in claim 1, wherein said second resistor has a negative temperature coefficient and the threshold signal is applied to said gate via said first resistance.

7. The temperature-actuated control circuit defined in claim 1 wherein said second, temperature-dependent resistance is connected to an external source of variable temperature such that said control circuit is actuated upon said external source attaining a predetermined temperature.

8. The temperature-actuated control circuit defined in claim 1 wherein the temperature coefficient of said second resistor is such that $I^2R$ heating thereof alters the resistance sufficiently to actuate said control circuit.

9. A temperature-actuated circuit for controlling the connection of a portion of an electrical circuit to the electrical circuit, comprising:

resistance means comprising first, second, and third resistors connected in series via a normally closed circuit path, the resistance of said second resistance being temperature dependent and the resistance of said third resistor being adjustable;

an SCR having a first, gate electrode connected between two of said series-connected resistors and having second and third electrodes such that, in the presence of a potential difference across said second and third electrodes, application of a signal of requisite threshold value to said gate via at least said first resistor actuates said SCR, thereby establishing a current across said second and third electrodes;

means for applying a potential difference across said second and third electrodes and across said resistance means such that upon said second resistor attaining a predetermined, temperature-dependent resistance value controlled by the adjustment of said third resistor, the threshold signal is applied to said gate; and relay means connected between the electrical circuit portion and the electrical circuit and connected to said resistance means and actuated by the SCR current for disconnecting the electrical circuit portion from the electrical circuit and for opening the circuit path of said resistance means.

10. The temperature-actuated control circuit defined in claim 9 wherein said second resistor has a negative temperature coefficient and said SCR gate electrode is connected between said first resistor and said second and third resistors.

11. The temperature-actuated control circuit defined in claim 9, further comprising namually operated switching means associated with said resistance means and said gate for shunting said second resistance to apply the threshold potential to said SCR.

12. The temperature-actuated control circuit defined in claim 9 further comprising a monitoring circuit actuated by the general signal for displaying the operated or nonoperated state of the temperature-actuated control circuit.

13. The temperature-actuated control circuit defined in claim 9 wherein said second, temperature-dependent resistance is connected to an external source of variable temperature such that said control circuit is actuated upon said external source attaining a predetermined temperature.

14. The temperature-actuated control circuit in claim 9 wherein the temperature coefficient of said second resistor is such that $I^2R$ heating thereof alters the resistance sufficiently to actuate said control circuit.

* * * * *